United States Patent [19]

Moore et al.

[11] Patent Number: 5,217,597
[45] Date of Patent: Jun. 8, 1993

[54] SOLDER BUMP TRANSFER METHOD

[75] Inventors: Kevin D. Moore, Schaumburg; John W. Stafford, St. Charles; Mauro Walker, Lake Barrington, all of Ill.

[73] Assignee: Motorola, Inc., Schaumburg, Ill.

[21] Appl. No.: 678,418

[22] Filed: Apr. 1, 1991

[51] Int. Cl.$^5$ .............................................. C25D 5/02
[52] U.S. Cl. .................................... 205/123; 205/125
[58] Field of Search ................... 204/15; 205/123, 125

[56] References Cited

PUBLICATIONS

Hatada, K., et al., "Application to the Electronic Instrument by Transferred Bump-Tab Technology", Proceedings of the 1987 International Symposium on Microelectronics (1987), pp. 649–653.

Koopman, Nick, "Solder Joining Technology", Mat. Res. Soc. Symp. Proc. vol. 154, Material Research Society (1989), pp. 431–439.

*Primary Examiner*—T. M. Tufariello
*Attorney, Agent, or Firm*—Douglas D. Fekete; Donald B. Southard; Anthony J. Sarli

[57] ABSTRACT

A method for forming a plurality of solder bumps on an electronic component substrate utilizes a transfer plate to electrodeposit solder deposits and subsequently reflow the deposits onto the substrate. The plate comprises discrete pad electrodes formed of a ceramic material that is suitably electrically conductive to permit electroplating of the solder alloy, but is not wet by the molten solder to permit reflow onto the substrate. A preferred electrode material is an indium oxide compound. The solder deposits are plated onto the electrodes, and the transfer plate is superposed on the substrate such that the bumps rest upon bond pads on the substrate. The assembly is heated and cooled to melt and resolidify the solder alloy, whereupon the solder bonds to the substrate pads to form the bumps.

14 Claims, 1 Drawing Sheet

SOLDER BUMP TRANSFER METHOD

BACKGROUND OF THE INVENTION

This invention relates to a method for forming solder bumps on an electronic component of the type useful for attaching the component to an electronic package. More particularly, this invention relates to such method utilizing a transfer plate having solder nonwettable ceramic electrodes onto which solder deposits are electroplated for reflow onto the component.

In the manufacture of an electronic component package, it is known to mount a first component, such as an integrated circuit semiconductor chip, to a second component, such as a chip carrier or a printed circuit board, by a plurality of solder bump interconnections. Each interconnection extends between a terminal pad on the first component and a terminal pad on the second component to physically attach the components and to electrically connect the terminal pads for conducting electrical signals therebetween for processing. Typically, the interconnections are formed by bonding solder bumps to each pad of the first component, assembling the components so that each bump rests on a corresponding pad on the second component, and heating and cooling the assembly to reflow the solder and complete the interconnection.

Solder bumps may be formed from preformed solder balls either individually placed on each pad or distributed using a stencil. Missing or misplaced balls create open circuits that result in a defective package. Such defects may not be discoverable until after the package is completed. Because of the large number of balls and the small size of the target pads, individual placement with the required accuracy tends to be time-consuming and tedious. On the other hand, failure to fill even a single hole of a stencil produces an open connection, which task is rendered more difficult by the pinprick size of the holes. Alternately, solder bumps may be formed directly on a component by vapor deposition or electroplating. In particular, for electroplating, several steps are needed to prepare the surface and to either prevent plating on unwanted regions or remove excess plate therefrom. Such techniques are not well suited for printed circuit boards wherein the component attachment region constitutes a relatively small portion of the entire surface area. Furthermore, poor plating at an individual pad for any reason may produce an undersized deposit that is difficult to detect, but fails to produce the desired interconnection. Thus, while electroplating has advantages in forming the solder bumps, plating directly onto a component jeopardizes the component, which is particularly significant because of the substantial cost to manufacture the component.

SUMMARY OF THE INVENTION

In accordance with this invention, an improved method for forming solder bumps uses a transfer plate to electroplate solder deposits and subsequently reflow the deposits onto an electronic component substrate. As used herein, the electronic component substrate may be any component intended to be incorporated into an electronic package by solder bump interconnection, including a semiconductor chip, a chip carrier or a printed circuit board. In general, the substrate features a plurality of solder wettable terminal pads disposed in a predetermined pattern on a generally planar surface. In accordance with this invention, a plurality of solder alloy deposits is electroplated onto discrete ceramic pad electrodes carried on the transfer plate. A preferred transfer plate comprises a glass or polymer sheet having a planar surface carrying a continuous thin film formed of an electrically conductive, solder nonwettable ceramic material, such as indium oxide compound, and further having an overlayer formed of an electrically insulative, solder nonwettable material that is patterned to define openings for exposing the conductive coating to form electrodes. The electrodes are disposed on the transfer plate surface in a pattern superimposable onto the substrate pad pattern. The deposits are suitably plated by immersing the transfer plate in an aqueous electroplating bath including dissolved solder metal salts and electrically biasing the conductive ceramic coating to locally deposit the solder alloy onto the exposed electrodes. The transfer plate is then arranged with the substrate such that each solder deposit rests upon a corresponding bond pad. This arrangement is heated to melt the solder deposit, whereupon the molten solder wets the bond pad, but not the electrode. Upon cooling, the solder alloy resolidifies to form bumps that are bonded to the substrate pads, but not to the transfer plate, thereby permitting the transfer plate to be readily separated from the substrate and reused. The resulting bumped substrate is ready for attachment to other components by solder bump interconnections to manufacture the electronic package.

A major feature of this invention concerns the ceramic coating on the transfer plate that is suitably electrically conductive to permit electroplating of the solder alloy, but is not wet by the molten solder alloy to permit reflow of the solder onto the substrate to form the desired bumps. Preferably, the transfer plate is transparent to permit the metallic solder deposits to be readily inspected to detect missing or undersized deposits. In the event that a defective deposit is discovered, the transfer plate may be removed from further processing without jeopardizing an expensive substrate. Also, the preferred transparent transfer plate facilitates accurate placement of the deposits in contact with the substrate pads. The plate is preferably formed of a material having a thermal expansion coefficient comparable to the substrate to maintain the deposits in contact with the substrate pads during heating and cooling to reflow the solder, thereby further assuring accurate transfer of the deposits onto the corresponding substrate pads. In one aspect of this invention, solder bumps are formed on a small region of a printed circuit board without processing the surrounding area. Therefore, this invention provides a method for concurrently forming solder bumps on a substrate that requires a minimal number of processing steps, and enhances the reliability of the solder bump interconnections.

BRIEF DESCRIPTION OF THE DRAWINGS

The present invention will be further described with reference to the accompanying drawings wherein.

DETAILED DESCRIPTION OF THE INVENTION

In accordance with a preferred embodiment, this invention is employed to form solder bumps on a region of a printed circuit board for subsequently attaching an integrated circuit die thereto.

Figure 1:
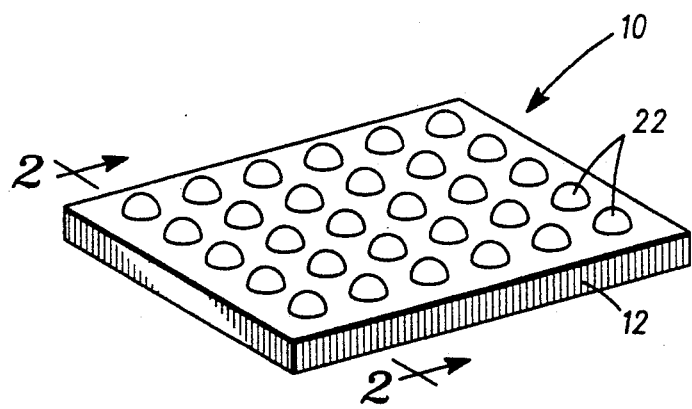
FIG. 1 is perspective view of a preferred solder transfer plate for use in the method of this invention.
Figure 2:
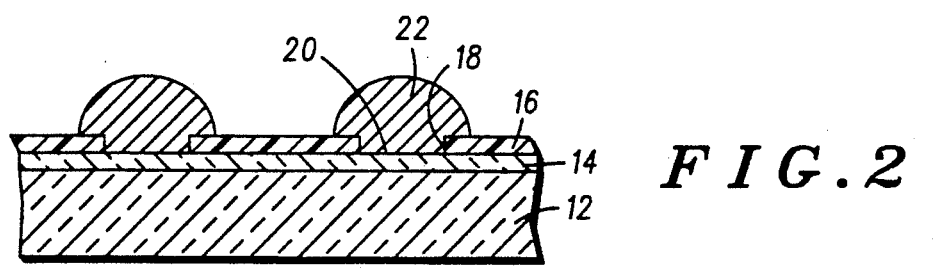
FIG. 2 is a cross-sectional view of the solder transfer plate in FIG. 1, taken along the line 2—2 in the direction of the arrows.

Referring to FIGS. 1 and 2, there is depicted a solder transfer plate 10 for use in the method of this invention. Plate 10 is formed of a glass sheet 12 having a transparent, electrically conductive, thin film ceramic coating 14, referred to as an ITO coating. The glass formulation is preferably selected to have thermal expansion coefficient comparable to the intended electronic substrate, which is about 15 ppm per °C. for an epoxy-base board in this embodiment. Coating 14 is formed of a solder nonwettable ceramic material composed predominantly of indium oxide and comprising about 10 percent by weight tin oxide. It will be appreciated that glass sheet having an ITO coating is commercially available and used in the manufacture of electronic displays and the like.

Coating 14 is covered by a polyimide overlayer 16 having openings 18 disposed in an array superimposable to the desired bump pattern. Layer 16 is formed by applying a photoimagable liquid film onto coating 14, selectively irradiating the film through a mask to develop the polymer for the layer except in regions where the openings are desired, removing the undeveloped film using aqueous KOH solvent to define openings 18, and baking to complete curing of the polymer layer to form the perforations 18. In this manner, regions 20 of electrically conductive coating 14 are exposed through openings 18 to serve as electrodes for electrodepositing solder alloy 22.

Solder deposits 22 are plated onto electrodes 20 of transfer plate 10 by a suitable tin-lead electroplating process. Transfer plate 10 is immersed in an aqueous acidic bath containing dissolved lead salt and tin salt. A suitable electroplating bath is composed of about 15.9 grams per liter lead added as lead fluoborate and 18.9 grams per liter tin added as tin fluoborate, and has a pH less than 1. The plate is immersed spaced apart from a suitable counterelectrode and connected to a DC power source to negatively bias coating 14 relative to the counterelectrode. Current flow is adjusted to provide a current density between about 0.016 and 0.027 amp per square centimeter and effective to reduce the tin and the lead to codeposit the metals onto electrode 20. The resulting deposit is composed of a near-eutectic alloy comprising about 60 percent tin and the balance lead.

Following deposition of solder deposits 22, plate 10 is inspected, for example, visually by the operator or by an automatic vision system, to assure that a deposit is formed onto each electrode 20. This inspection is facilitated by the transparency of glass sheet 12, thin film coating 14 and polymer coating 16.

Figure 3:
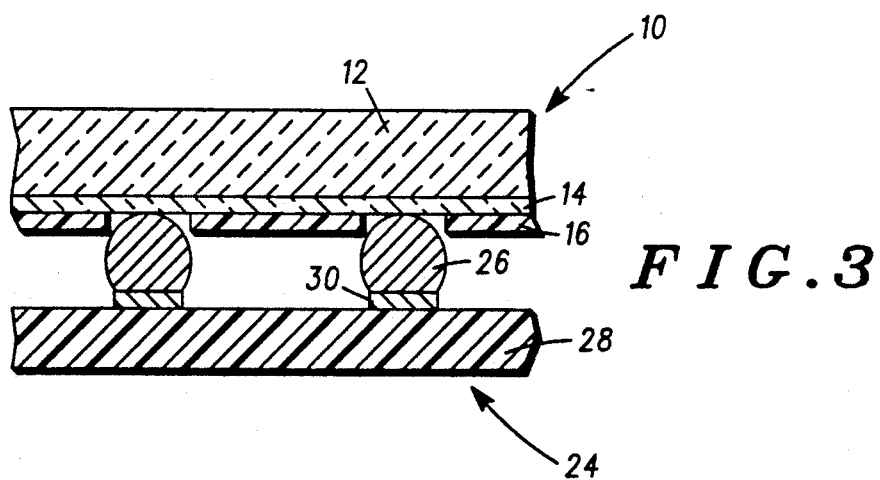
FIG. 3 shows an arrangement of the solder transfer plate in FIG. 1 with an electronic component following reflow of the solder in accordance with the method of this invention.

Transfer plate 10 carrying bumps 22 is arranged with substrate 24 as shown in FIG. 3 in preparation for transferring the solder alloy to the substrate to form solder bumps 26. Substrate 24 is formed of a laminated glass fiber-reinforced epoxy board, designated FR4 in the industry, and includes a region 28, depicted in the figures, that comprises plated copper terminal pads 30. Substrate 24 may include additional features (not shown), particularly on regions adjacent chip attachment region 28, as necessary for processing electrical signals by the product package. In accordance with this embodiment, transfer plate 10 is arranged face-down with substrate 24 with deposits 22 resting upon pads 30. Prior to arranging the transfer plate, pads 30 are prepared by successively depositing a thin nickel plate and a thin gold plate and coating with a suitable flux, such as water white rosin flux, to facilitate solder bonding. Accurate placement of deposits 22 onto pads 30 is facilitated by the transparent nature of transfer plate 10. It is found that electroplated deposits 22 adhere suitably to transfer plate 10 to permit inversion as indicated in FIG. 3. Alternately, transfer plate 10 may be arranged with substrate 24 overlying the transfer plate. In either event, the arrangement is heated to a temperature of about 220° C. to melt and reflow the solder alloy. Upon melting, the molten solder produces droplets that wet pads 30. However, the molten alloy does not wet either ceramic coating 14 or polymer overlayer 16. As a result, upon cooling the arrangement to resolidify the solder alloy, the solder bonds to pads 30, but does not bond to the transfer plate. The transfer plate is readily separated from substrate 24, leaving solder bumps 26 bonded to pads 30 thereon.

Figure 4:
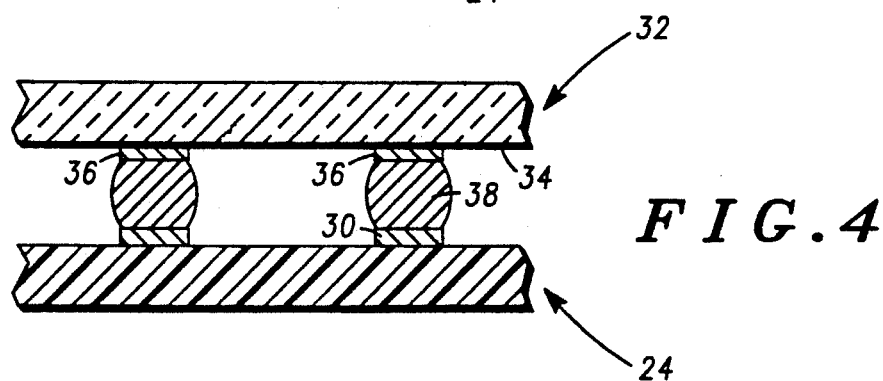
FIG. 4 show a package comprising solder interconnections obtained from solder bumps formed in accordance with this invention.

Following transfer of the solder alloy from plate 10 to substrate 24, substrate 24 is then arranged with a semiconductor die 32 in the manner shown in FIG. 4. Die 32 has a generally planar surface 34 that includes aluminum terminal pads 36, as well as other features electrically connected to pads 36, but omitted from the figures.

Die 32 is assembled with substrate 24 such that each bump 26 rests upon a corresponding terminal pad 36. Prior to assembly, pads 36 are prepared by sputter depositing a chromium film, a copper film and a gold film and coated with a water white rosin flux. The die-substrate assembly is heated to about 220° C. to melt and reflow solder bump 26. Upon melting, the molten solder wets terminal pads 36. The assembly is then cooled to resolidify the solder alloy, thereby forming an interconnection 38 that bonds terminal pad 30 on substrate 24 to terminal pad 36 on chip 32 to thereby attach the chip to the substrate and electrically connect the terminals. The assembly is then ready for additional processing as required to complete the electronic component package.

In the described embodiment the method of this invention is employed to form a plurality of solder bumps on a chip attachment region of a printed circuit board. The method may be adapted to form solder bumps on other components of an electronic package. In an alternate embodiment, the method of this invention is employed to form solder bumps directly on a semiconductor silicon die similar to chip 32 in FIG. 4. This is accomplished using a plate similar to plate 10 in FIGS. 1 and 2, but preferably including a glass sheet having a thermal coefficient of expansion similar to silicon. For example, borosilicate glass sheet is available having a thermal expansion coefficient of 2.7 ppm per °C., which is similar to the silicon thermal expansion coefficient of about 2.6 ppm per °C. Solder deposits are electroplated onto ITO electrodes on the plate, which is then arranged with the die and heated to reflow the solder onto the die, thereby forming the desired solder bumps. Thereafter the die may then be suitably attached, either to a chip carrier or to a printed circuit board by a solder bump interconnection process.

A key feature of this invention is the use of a transfer plate having electrodes formed of a ceramic material that is sufficiently electrically conductive to permit electrodeposition of the solder alloy, but is not wet by the molten solder alloy. The preferred ceramic material is composed predominantly of indium oxide and contains tin oxide to enhance electrical conductivity. Alternately, the electrodes may be suitably formed of other electrically conductive, solder nonwettable ceramics, including tin oxide or silver oxide. In the described embodiment, the glass sheet was covered by the conductive coating and an insulative overlayer was applied to define the electrodes. The continuous film is believed to optimize distribution of the plating current to obtain more uniform current density, which in turn produces more uniform deposits. Alternately, the ceramic film may be suitably patterned, for example by etching, to define discrete pad-like electrodes.

While the described transfer plate comprises a glass base, the base may be formed of other suitable materials, including nontransparent materials such as silicon or epoxy-base FR4 board of the type used for printed circuit boards. Preferably, the base for the transfer plate exhibits a thermal expansion coefficient similar to the substrate. Also, while in the described embodiment the method was applied to form the solder interconnections of a particular tin-lead alloy, the electroplating bath and parameters may be selected to deposit other suitable solder alloys. Other common electroplatable alloys include lead alloys containing about 5 percent tin and tin alloys containing about 30 percent indium.

While this invention has been described in terms of certain embodiments thereof, it is not intended that it be limited to the above description but rather only to the extent set forth in the claims that follow.

The embodiments of the invention in which an exclusive property or privilege is claimed are defined as follows:

1. A method for concurrently forming a plurality of solder bumps on a substrate such that each bump is bonded to a solder wettable terminal bond pad disposed in a pattern on a generally planar surface of the substrate, said method comprising
    electrodepositing a plurality of solder alloy deposits onto discrete ceramic pad electrodes carried by a transfer plate, said electrodes being disposed on a generally planar surface of the transfer plate in a pattern superposable onto the substrate pad pattern and being formed of an electrically conductive ceramic material nonwettable by the solder alloy,
    assembling the transfer plate against the substrate such that each solder deposit rests upon a corresponding bond pad,
    heating the assembly to melt the solder deposits, whereupon each molten solder deposit forms a droplet that wets the bond pad and does not wet the electrode,
    cooling the assembly to resolidify the droplets to form bumps bonded to the bond pads, and
    separating the transfer plate from the substrate, whereby the bumps remain bonded to the substrate.

2. A method in accordance with claim 1 wherein the transfer plate comprises a glass sheet having a continuous coating formed of an electrically conductive ceramic material that is nonwettable by molten solder alloy, said plate further comprises a solder nonwettable, electrically insulative overlayer covering the ceramic coating and having perforations for exposing the ceramic coating to form the electrodes.

3. A method in accordance with claim 2 wherein the ceramic coating is composed of electrically conductive indium oxide material.

4. A method in accordance with claim 2 wherein the electroplating step comprises immersing the transfer plate into an aqueous bath spaced apart from a suitable counterelectrode, said bath comprising dissolved tin and lead ions, and electrically biasing the electrically conductive ceramic coating relative to the counterelectrode to plate metallic tin-lead alloy onto the electrodes.

5. A method in accordance with claim 1 wherein the transfer plate is formed of a transparent sheet to facilitate accurate placement of the deposits onto the terminal bond pads and having a thermal coefficient of expansion similar to the substrate to maintain the deposits in registry with the terminal bond pads during said heating and cooling to bond the solder bumps to the pads.

6. A method for concurrently forming a plurality of solder bumps on a glass fiber-reinforced polymer substrate such that each bump is bonded to a copper-base terminal bond pad disposed in a predetermined pattern on a generally planar surface of the substrate, said method comprising
    electroplating a plurality of tin-lead solder alloy deposits onto discrete ceramic pad electrodes on a transfer plate, said electrodes being disposed on a generally planar surface of the transfer plate in a pattern superposable onto the substrate terminal pattern and being formed of a solder nonwettable, electrically conductive ceramic material,
    assembling the transfer plate against the substrate such that each solder deposit rests upon a corresponding terminal pad,
    heating the assembly to melt the solder deposits, whereupon each deposit forms a molten droplet that wets the copper pad but does not wet the ceramic electrode,
    cooling the assembly to resolidify the solder droplets to form bumps bonded to the bond pads, and
    separating the transfer plate from the substrate, whereby the solder bumps remain bonded to the substrate for use in subsequently attaching an electronic component to the substrate by a plurality of solder interconnections.

7. A method in accordance with claim 6 wherein the transfer plate comprises a glass sheet having a continuous coating formed of an electrically conductive ceramic material that is nonwettable by molten solder alloy, said plate further comprises a solder nonwettable, electrically insulative overlayer covering the ceramic coating and having perforations for exposing the ceramic coating to form the electrodes.

8. A method in accordance with claim 7 wherein the ceramic layer is composed predominantly of indium oxide compound containing tin oxide in an amount effective to enhance electrical conductivity.

9. A method in accordance with claim 7 wherein the electroplating step comprises immersing the transfer plate into an aqueous bath spaced apart from a suitable counterelectrode, said bath comprising dissolved tin and lead ions, and electrically biasing the electrically conductive ceramic coating relative to the counterelectrode to plate metallic tin-lead alloy onto the electrodes.

10. A method in accordance with claim 7 wherein the transfer plate is formed of a transparent sheet to facilitate accurate placement of the deposits onto the terminal bond pads and having a thermal coefficient of expansion similar to the substrate to maintain the deposits in registry with the terminal bond pads during said heating and cooling to bond the solder bumps to the pads.

11. A method for concurrently forming a plurality of solder bumps on a silicon die such that each bump is bonded to a terminal bond pad disposed in a predetermined pattern on a generally planar surface of the die, said method comprising electroplating a plurality of tin-lead solder alloy deposits onto discrete ceramic pad electrodes disposed on a generally planar surface of a transfer plate in a pattern superposable relative to the die terminal pattern and being formed of an electrically conductive ceramic material, assembling the transfer plate against the die such that each solder deposit rests upon a corresponding terminal pad, heating the assembly to melt the solder deposits, whereupon each molten deposit coalesces to form a droplet that wets the die pad but does not wet the electrode, cooling the assembly to resolidify the solder droplets to form bumps bonded to the die pads but not to the electrodes, and separating the transfer plate from the die, whereby the solder bumps remain bonded to the die for use in subsequently attaching the die to a substrate by a plurality of solder interconnections.

12. A method in accordance with claim 11 wherein the transfer plate comprises a glass sheet having a continuous coating formed of an electrically conductive indium oxide compound containing about 10 percent by weight tin oxide and further comprises a solder nonwettable, electrically insulative overlayer covering the coating and having perforations for selectively exposing the coating to form the electrodes.

13. A method in accordance with claim 11 wherein the electroplating step comprises immersing the transfer plate into an aqueous bath spaced apart from a suitable counterelectrode, said bath comprising dissolved tin and lead ions, and electrically biasing the electrically conductive ceramic coating relative to the counterelectrode to plate metallic tin-lead alloy onto the electrodes.

14. A method in accordance with claim 11 wherein the transfer plate is formed of a transparent sheet to facilitate accurate placement of the deposits onto the terminal bond pads and having a thermal coefficient of expansion similar to the substrate to maintain the deposits in registry with the terminal bond pads during said heating and cooling to bond the solder bumps to the pads.

* * * * *